United States Patent
Abe et al.

(10) Patent No.: US 11,719,982 B2
(45) Date of Patent: *Aug. 8, 2023

(54) DISPLAY DEVICE

(71) Applicant: Japan Display Inc., Tokyo (JP)

(72) Inventors: Hiroyuki Abe, Tokyo (JP); Kentaro Agata, Tokyo (JP); Masaki Murase, Tokyo (JP); Kazune Matsumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/552,410

(22) Filed: Dec. 16, 2021

(65) Prior Publication Data

US 2022/0107526 A1   Apr. 7, 2022

Related U.S. Application Data

(63) Continuation of application No. 17/073,729, filed on Oct. 19, 2020, now Pat. No. 11,231,627, which is a
(Continued)

(30) Foreign Application Priority Data

Feb. 17, 2016  (JP) .................. 2016-027838

(51) Int. Cl.
*G02F 1/1345*  (2006.01)
*H05K 9/00*  (2006.01)
(Continued)

(52) U.S. Cl.
CPC ........ *G02F 1/13458* (2013.01); *G02F 1/1368* (2013.01); *G02F 1/133345* (2013.01);
(Continued)

(58) Field of Classification Search
CPC ........... G02F 1/13458; G02F 2201/123; G02F 1/136227; G02F 1/136286; G02F 1/1368;
(Continued)

(56) References Cited

U.S. PATENT DOCUMENTS 10,656,479 B2 *  5/2020  Abe .................... G02F 1/13458
11,231,627 B2 *  1/2022  Abe .................... H05K 9/0096
(Continued)

FOREIGN PATENT DOCUMENTS

JP   2008-070584 A    3/2008
JP   2010-085551 A    4/2010
(Continued)

OTHER PUBLICATIONS

Japanese Office Action dated Nov. 8, 2022, for the corresponding Japanese Patent Application No. 2022-021788, with English machine translation.

*Primary Examiner* — Jose R Diaz
(74) *Attorney, Agent, or Firm* — Michael Best & Friedrich LLP

(57) ABSTRACT

In an IPS-mode liquid crystal display device, the area of a terminal portion is decreased. A liquid crystal display device includes a TFT substrate and a counter substrate attached to the TFT substrate with a sealing material, and includes a display region and a terminal portion formed on the TFT substrate. A shielding transparent conductive film is formed on the outer side of the counter substrate. On the terminal portion, an earth pad formed with a transparent conductive film is formed on an organic passivation film. The shielding transparent conductive film is connected to the earth pad through a conductor. Below organic passivation film of the terminal portion, a wire is formed.

9 Claims, 13 Drawing Sheets

Related U.S. Application Data continuation of application No. 16/850,311, filed on Apr. 16, 2020, now Pat. No. 10,845,655, which is a continuation of application No. 16/129,914, filed on Sep. 13, 2018, now Pat. No. 10,656,479, which is a continuation of application No. 15/427,406, filed on Feb. 8, 2017, now Pat. No. 10,101,618.

(51) Int. Cl.
| | | |
|---|---|---|
| *G02F 1/1362* | (2006.01) | |
| *G02F 1/1333* | (2006.01) | |
| *G02F 1/1343* | (2006.01) | |
| *G02F 1/1368* | (2006.01) | |
| *H01L 27/12* | (2006.01) | |
| *G02F 1/1335* | (2006.01) | |

(52) U.S. Cl.
CPC .. *G02F 1/134309* (2013.01); *G02F 1/136227* (2013.01); *G02F 1/136286* (2013.01); *H01L 27/1248* (2013.01); *H05K 9/0096* (2013.01); *G02F 1/13452* (2013.01); *G02F 1/13629* (2021.01); *G02F 1/133519* (2021.01); *G02F 1/134363* (2013.01); *G02F 1/136204* (2013.01); *G02F 1/136218* (2021.01); *G02F 1/136295* (2021.01); *G02F 2201/121* (2013.01); *G02F 2201/123* (2013.01); *G02F 2201/50* (2013.01); *H01L 27/124* (2013.01)

(58) Field of Classification Search
CPC ........... G02F 2201/121; H01L 27/1248; H01L 27/124
See application file for complete search history.

(56) References Cited

U.S. PATENT DOCUMENTS

| | | | | |
|---|---|---|---|---|
| 11,300,836 | B2* | 4/2022 | Shiina | G02F 1/136286 |
| 2013/0027626 | A1* | 1/2013 | Namiki | G02F 1/136204 |
| | | | | 349/43 |
| 2013/0342779 | A1* | 12/2013 | Jung | G02F 1/136227 |
| | | | | 349/43 |
| 2017/0146878 | A1* | 5/2017 | Hirata | G02F 1/133345 |

FOREIGN PATENT DOCUMENTS

| | | |
|---|---|---|
| JP | 2012-220677 A | 11/2012 |
| JP | 2013-029767 A | 2/2013 |

* cited by examiner

DISPLAY DEVICE

CROSS-REFERENCE TO RELATED APPLICATIONS

This application is a continuation of U.S. patent application Ser. No. 17/073,729 filed on Oct. 19, 2020, which, in turn, is a continuation of U.S. patent application Ser. No. 16/850,311 (now U.S. Pat. No. 10,845,655) filed on Apr. 16, 2020, which, in turn, is a continuation of U.S. patent application Ser. No. 16/129,914 (now U.S. Pat. No. 10,656,479) filed on Sep. 13, 2018, which, in turn, is a continuation of U.S. patent application Ser. No. 15/427,406 (now U.S. Pat. No. 10,101,618) filed on Feb. 8, 2017. Further, this application claims priority from Japanese Patent Application No. 2016-027838 filed on Feb. 17, 2016, the entire contents of which are hereby incorporated by reference into this application.

BACKGROUND OF THE INVENTION

(1) Filed of the Invention

The present invention relates to a display device, and more specifically to a liquid crystal display device that decreases its outer size by reducing a terminal region.

(2) Description of the Related Art

A liquid crystal display device includes a thin film transistor (TFT) substrate and a counter substrate disposed opposed to the TFT substrate. The TFT substrate includes pixels each having a pixel electrode, a thin film transistor, and other elements in a matrix configuration. A liquid crystal is sandwiched between the TFT substrate and the counter substrate. Images are formed by controlling the light transmittance of liquid crystal molecules in each pixel.

The liquid crystal display device has a problem of viewing angles. The in-plane switching (IPS) mode is a method in which liquid crystal molecules are rotated by an electric field in parallel with the substrate to change the transmittance of a liquid crystal layer, and the method has excellent viewing angle characteristics. Basically in the IPS mode, it is unnecessary to form a counter electrode on the counter substrate. Thus, this allows a simplified structure. However, external noise is easily entered from the counter substrate side.

In order to prevent external noise from being entered, a shielding conductive layer (a shielding ITO) is formed on the outer surface of the counter substrate. The configuration of the shielding ITO is described in Japanese Patent Application Laid-Open No. 2011-123231, for example. Japanese Patent Application Laid-Open No. 2011-123231 describes a configuration in which a shielding ITO of a counter substrate is connected to a pad formed on a TFT substrate using a resin.

The shielding ITO formed on the surface of the counter substrate has to be connected to an earth or reference potential. For this connection, an earth pad is formed on the TFT substrate side, and the earth pad is connected to the shielding ITO of the counter substrate using a conductive tape, for example. However, in order to maintain the adhesive strength of the conductive tape, the earth pad needs a certain area. The area of the earth pad is an area of 3 mm×1.8 mm, for example.

The definition of the liquid crystal display device is higher, which results in providing a large number of wires as well. In order to form these wires on a terminal portion, the terminal portion needs a certain area. On the other hand, specifically in middle- or small-sized liquid crystal display devices, it is demanded to decrease the outer size of the liquid crystal display panel. This also demands a smaller area of the terminal portion. However, the earth pad needs a predetermined area, and this imposes a limit on a decrease in the size of the liquid crystal display panel.

An object of the present invention is to achieve a configuration that allows a decrease in the area of the terminal portion with a necessary area of an earth pad being secured and the downsizing of a liquid crystal display panel.

SUMMARY OF THE INVENTION

An object of the present invention is to solve the problems. Specific main aspects are as follows.

(1) A liquid crystal display device including a TFT substrate and a counter substrate attached to the TFT substrate with a sealing material and includes a display region and a terminal portion formed on the TFT substrate. A shielding transparent conductive film is formed on the outer side of the counter substrate. On the terminal portion, an earth pad formed with a transparent conductive film is formed on an organic passivation film. The shielding transparent conductive film is connected to the earth pad through a conductor. Below the organic passivation film of the terminal portion, a wire is formed.

(2) A liquid crystal display device including a TFT substrate and a counter substrate attached to the TFT substrate with a sealing material and includes a display region and a terminal portion formed on the TFT substrate. On the terminal portion, a first wire extending in a first direction and a second wire extending in a second direction are present. At an intersecting part of the first wire with the second wire, the second wire is separated into a first portion and a second portion. At the intersecting part, an organic film is formed covering the first wire and the second wire. On the organic film, a transparent conductive film is formed. The second wire is connected to the transparent conductive film through a through hole formed on the organic film. The first portion is connected to the second portion through the transparent conductive film.

DETAILED DESCRIPTION OF THE PREFERRED EMBODIMENTS

In the following, the content of the present invention will be described in detail using embodiments.

First Embodiment

Figure 1:
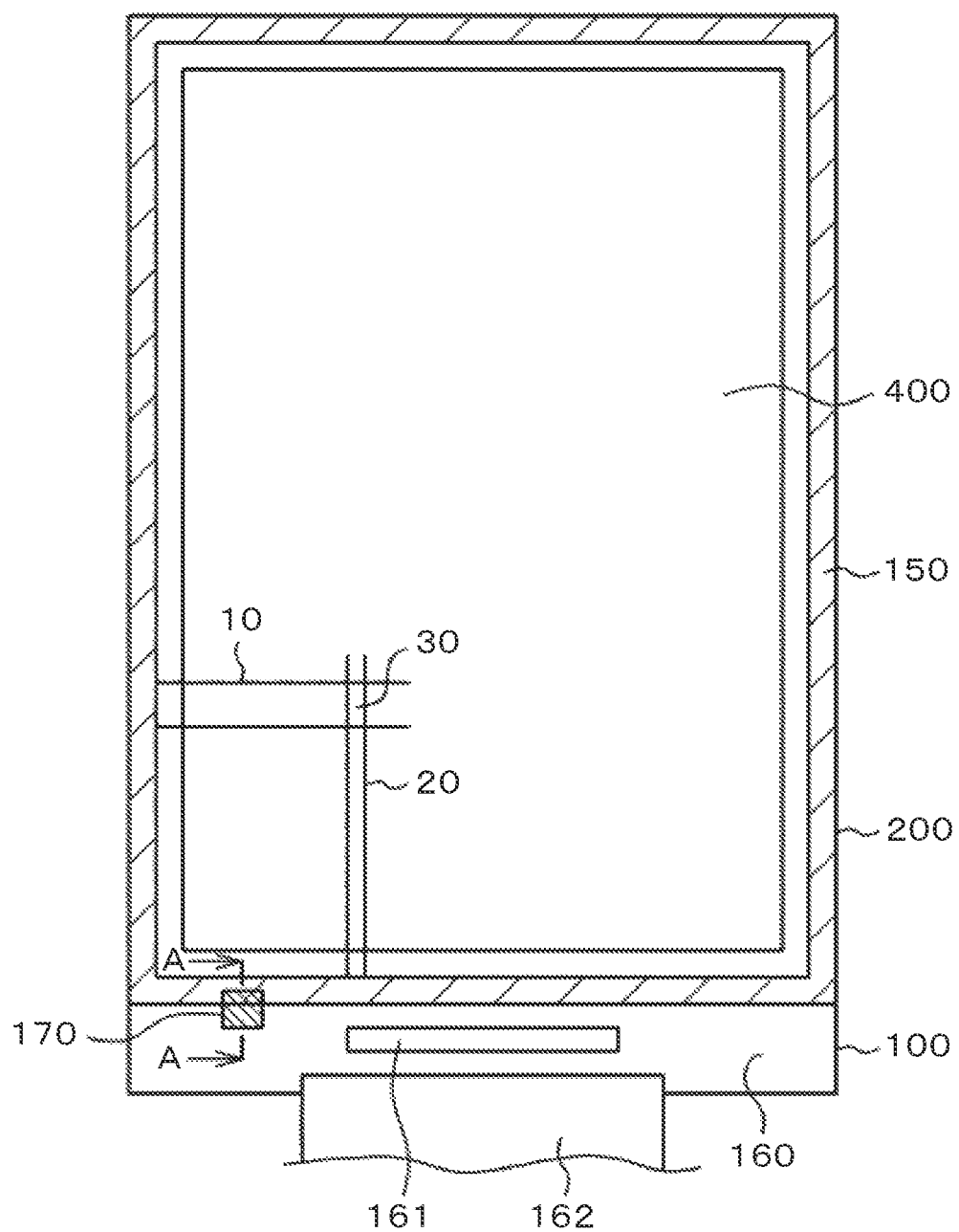
FIG. 1 is a plan view of a liquid crystal display device to which an embodiment of the present invention is applied.

FIG. 1 is a plan view of a liquid crystal display device to which an embodiment of the present invention is applied. FIG. 1 is a liquid crystal display device for use in a mobile telephone, for example. In FIG. 1, on a TFT substrate 100, scanning lines 10 are arrayed in the vertical direction, which extend in the lateral direction. Picture signal lines 20 are arrayed in the lateral direction, which extend in the vertical direction. A region surrounded by the scanning lines 10 and the picture signal lines 20 is a pixel 30.

In FIG. 1, the TFT substrate 100 is attached to a counter substrate 200 with a sealing material 150. On the inner side of the sealing material 150, a display region 400 is formed. The TFT substrate 100 is formed greater than the counter substrate 200. A portion where only the TFT substrate 100 is provided is a terminal portion 160. On the terminal portion (the terminal region) 160, a driver IC 161 that drives a liquid crystal display panel is disposed, to which a flexible circuit board 162 is connected for supplying power and signals to the liquid crystal display panel.

FIG. 1 is an IPS-mode liquid crystal display panel. On the surface of the counter substrate 200, a shielding conductive layer (a shielding ITO) is formed. In order to connect the shielding ITO to an earth potential or a reference potential, an earth pad is formed on the terminal portion, and the earth pad is connected to the shielding ITO of the counter substrate using a conductive tape 170, for example.

The conductive tape 170 is in a configuration, for example, in which an adhesive material having fine conductive particles dispersed is formed on one face of a metal tape, such as an Al tape and a copper tape. In other words, the conductive tape 170 is attached to the shielding ITO and the earth pad with the adhesive material. Thus, in order to maintain adhesive strength, the earth pad needs a predetermined area. The presence of the earth pad is a problem of decreasing the area of the terminal portion.

The shielding ITO can be connected to the earth pad using the conductive tape as well as using a conductive resin and metal paste, for example. However, also in this case, the earth pad similarly needs a certain area. In the following, the description is made in which the shielding ITO is connected to the earth pad using the conductive tape. The embodiment of the present invention is similarly applicable in the case of using a conductive resin and metal paste, for example.

Figure 2:
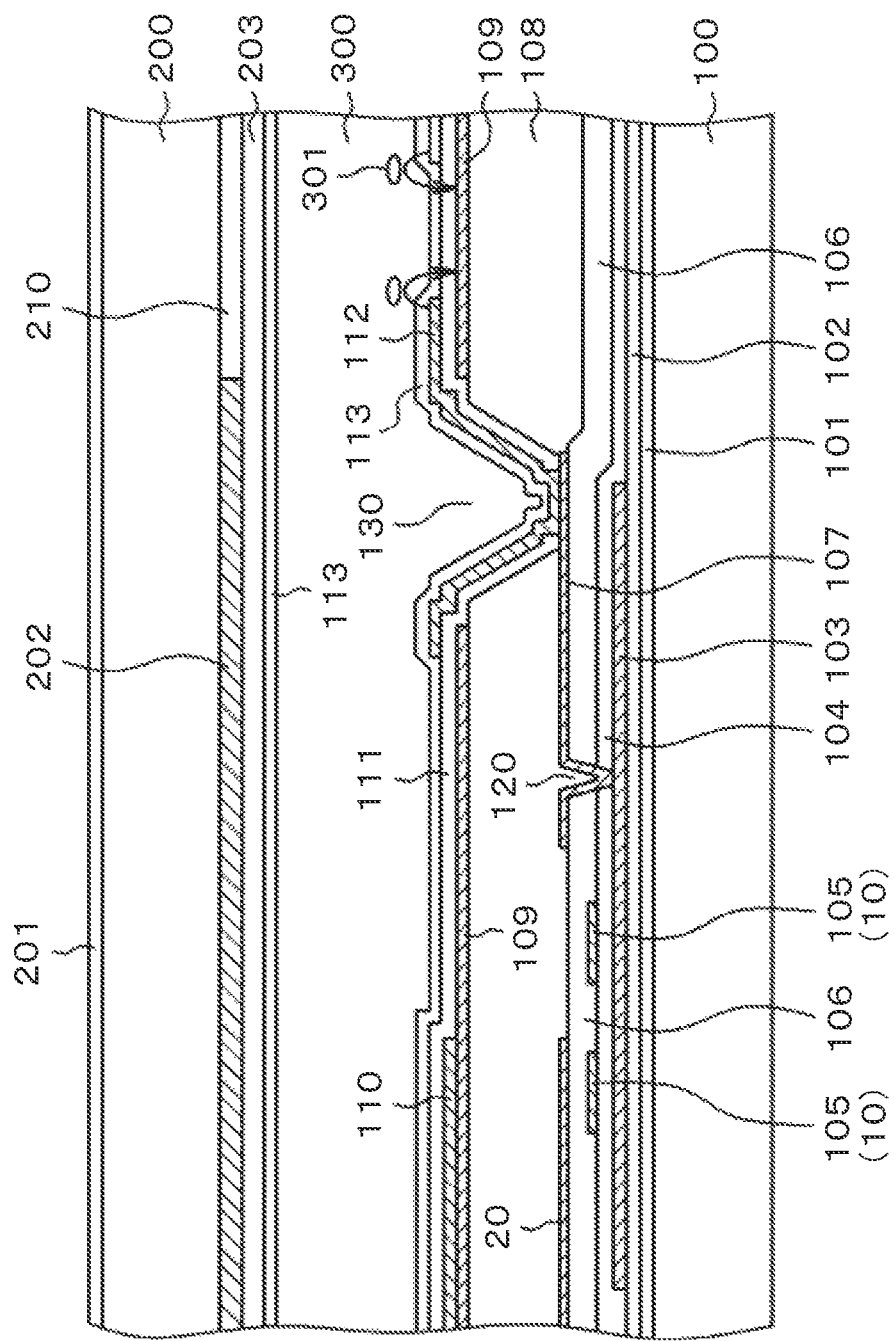
FIG. 2 is a cross sectional view of a pixel in a display region.

FIG. 2 is a cross sectional view of the pixel in the display region of the IPS-mode liquid crystal display device. There are a variety of the IPS mode display devices. For example, a present main stream method is a method in which a common electrode is formed flatly, a comb-teeth pixel electrode is disposed on the common electrode with an insulating film being sandwiched, and liquid crystal molecules are rotated using an electric field generated between the pixel electrode and the common electrode. The reason is because this method can relatively increase the transmittance.

FIG. 2 is a cross sectional view of such an IPS-mode liquid crystal display device. A TFT in FIG. 2 is a so-called top gate TFT. A semiconductor to be used is low-temperature Poli-Si (LTPS). In contrast, in the case of using an amorphous silicon (a-Si) semiconductor, a so-called bottom gate TFT is often used. In the following description, the description will be made using an example of the case of using a top gate TFT. The embodiment of the present invention is also applicable in the case of using a bottom gate TFT. Moreover, oxide is also usable instead of silicon.

In FIG. 1, on the glass substrate 100, a first base film 101 made of silicon nitride (SiN) and a second base film 102 made of silicon oxide ($SiO_2$) are formed by chemical vapor deposition (CVD). The first base film 101 and the second base film 102 are responsible for preventing a semiconductor layer 103 from being contaminated by impurities from the glass substrate 100.

On the second base film 102, the semiconductor layer 103 is formed. The semiconductor layer 103 is a layer made of a poly-Si film, in which an a-Si film is formed on the second base film 102 by CVD and is laser-annealed and converted into the poly-Si film. The poly-Si film is patterned by photolithography.

On the semiconductor film 103, a gate insulating film 104 is formed. The gate insulating film 104 is an $SiO_2$ film made of tetraethoxysilane (TEOS). This film is also formed by CVD. On the gate insulating film 104, a gate electrode 105 is formed. The scanning line 10 also functions as the gate electrode 105. The gate electrode 105 is formed of an Mo alloy e.g. an MoW film. When it is necessary to decrease the resistance of the gate electrode 105 or the scanning line 10, a stack of an Al alloy or Al alloy and an Mo alloy is used.

After that, an interlayer insulating film 106 is formed of $SiO_2$, which covers the gate electrode 105. The interlayer insulating film 106 is provided for insulating the scanning line 10 from the picture signal line 20 or for insulating the gate electrode 105 from the contact electrode 107. On the interlayer insulating film 106 and the gate insulating film 104, a contact hole 120 is formed for connecting the semiconductor layer 103 to a contact electrode 107.

On the interlayer insulating film 106, the contact electrode 107 is formed. The semiconductor layer 103 is connected to the picture signal line 20 through the contact hole at a potion not shown.

The contact electrode 107 and the picture signal line 20 are simultaneously formed on the same layer. In order to decrease the resistance of the contact electrode 107 and the picture signal line 20, an Al alloy e.g. AlSi alloy is used. Since the AlSi alloy causes hillocks, or defuses its Al to other layers, a structure is provided, in which the AlSi alloy layer is sandwiched between an MoW barrier layer and a cap layer, for example. However, in the specification, a configuration is also simply referred to as an Al alloy wire.

An organic passivation film (an organic film) 108 is formed covering the picture signal line 20 or the contact electrode 107. The organic passivation film 108 is formed of a photosensitive acrylic resin. In addition to acrylic resins, the organic passivation film 108 can also be formed of a silicone resin, epoxy resin, polyimide resin, and other resins. Since the organic passivation film 108 functions as a planarization film, this film is formed thickly. In many cases, the film thickness of the organic passivation film 109 is in a range of 2 to 4 µm. In the embodiment, the film thickness is in a range of about 3 to 4 µm.

As described later, in the embodiment of the present invention, the organic passivation film 108 is left on a part of the terminal portion 160, and an earth pad formed of a conductive film, such as indium tin oxide (ITO), is formed on the organic passivation film 108. Thus, this allows wires to be formed also on the lower side of the earth pad, and the area of the terminal portion 160 is decreased.

In order to conduct the continuity between the pixel electrode 112 and the contact electrode 107, a contact hole 130 is formed on the organic passivation film 108. A photosensitive resin is used for the organic passivation film 108. After coating a photosensitive resin, this resin is exposed, and then only portions to which light is applied are dissolved in a specific developer. In other words, forming a photoresist can be omitted using a photosensitive resin. After forming the contact hole 130 on the organic passivation film 108, the organic passivation film is baked at a temperature of about 230° C., and thus the organic passivation film 108 is finally formed. In this baking, an earth pad organic passivation film 108 to be formed on the terminal portion 160 is also simultaneously formed.

After baking, ITO to be the common electrode 109 is formed by sputtering, and then patterned so as to remove the ITO from the contact hole 130 and the portions around the contact hole 130. The common electrode 109 can be flatly formed common in the pixels. ITO has a large resistivity. Thus, in order to prevent a voltage drop in the common electrode 109, a common metal wire 110 is formed being overlapped with the common electrode 109. In order to prevent the transmittance of the pixel from being dropped, the common metal wire 110 is formed on a portion overlapped with the picture signal line 20 or the scanning line 10 in a planner view.

After that, SiN to be a capacitive insulating film 111 is formed on throughout the surface by CVD. Since the capacitive insulating film 111 is also responsible for forming the retention capacitance between the pixel electrode 112 and the common electrode 109, the capacitive insulating film 111 has this name. After that, in the contact hole 130, a contact hole for conducting the continuity between the contact electrode 107 and a pixel electrode 112 is formed on the capacitive insulating film 111.

After that, ITO is formed by sputtering, and patterned to form the pixel electrode 112. On the pixel electrode 112, an alignment film material is applied by flexographic printing, ink jet, and other methods, and then baked to form an alignment film 113. For the alignment process of the alignment film 113, photo-alignment using polarized ultraviolet rays is used in addition to rubbing.

When a voltage is applied across the pixel electrode 112 and the common electrode 110, electric flux lines as illustrated in FIG. 2 are generated. Liquid crystal molecules 301 are rotated by these electric fields, and the amount of light transmitted through the liquid crystal layer 300 is controlled for each pixel. Thus, images are formed.

In FIG. 2, the counter substrate 200 is disposed with the liquid crystal layer 300 being sandwiched. On the inner side of the counter substrate 200, a color filter 201 is formed. On the color filter 201, red, green, and blue color filters are individually formed on the pixels. Thus, color images are formed. A black matrix 202 is formed between the color filters 201 for improving the contrast of images. Note that, the black matrix 202 is also responsible for the light shielding film of the TFT, and prevents a photocurrent from being carried through the TFT.

An overcoat film 203 is formed covering the color filter 201 and the black matrix 202. The overcoat film 203 is provided for preventing the material of the color filter 201 from being dissolved into the liquid crystal layer 300. On the overcoat film 203, an alignment film 113 that determines the initial alignment of the liquid crystal molecules 301 is formed. Similarly to the alignment film 113 on the TFT substrate 100 side, rubbing or photo-alignment is used for the alignment process of the alignment film 113.

As described above, in the IPS mode, it is unnecessary to form the counter electrode on the counter substrate. When the configuration as illustrated in FIG. is formed, it is difficult to shield noise from the counter substrate side. Therefore, a shielding ITO 210 is formed on the surface of the counter substrate for shielding external noise. The thickness of the shielding ITO 210 is in a range of about 200 to 300 nm. However, in order to shield noise, the shielding ITO 210 has to be connected to an earth or a reference potential (in the following, referred to as an earth).

Figure 3:
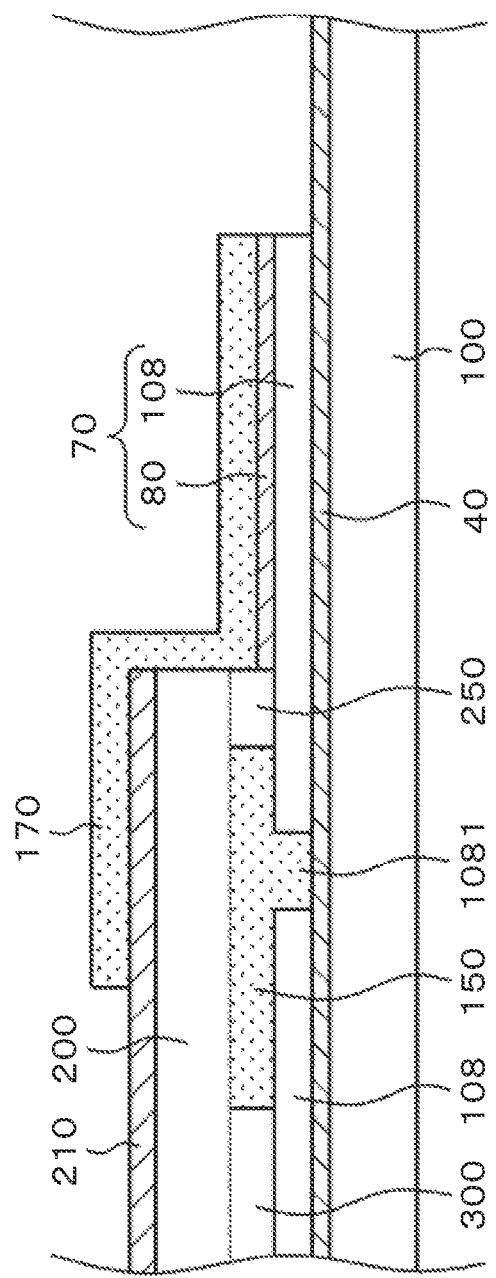
FIG. 3 is a cross sectional view of a portion near an earth pad according to a first embodiment.

The conductive tape 170 in FIG. 1 is provided for connecting the shielding ITO 210 to the earth pad to be the earth potential. FIG. 3 is a cross sectional view taken along line A-A in FIG. 1, illustrating a cross sectional view of the portion of the earth pad. In FIG. 3, the TFT substrate 100 is attached to the counter substrate 200 with the sealing material 150. The liquid crystal 300 is sandwiched between the TFT substrate 100 and the counter substrate 200. At the end portion of the counter substrate 200, a wall-like spacer 250 is formed, not the sealing material 150. The wall-like spacer 250 is provided for removing a part of the counter substrate 200 from the terminal side by scribing.

In FIG. 3, as the layers on the TFT substrate 100 side, only the organic passivation film 108 is illustrated. A groove 1081 is formed on the part of the organic passivation film 108 overlapped with the sealing material 150. The groove 1081 is provided for preventing external moisture from being entered through the organic passivation film 108.

The embodiment of the present invention is characterized in that in the terminal portion 160, the organic passivation film 108 extends to the portion on which the earth pad 70 is formed. A transparent conductive film 80, such as connection ITO, is formed on the organic passivation film 108, and thus the earth pad 70 is formed. With this configuration, the region below the earth pad 70 can also be used as the wire region, which allows the area of the terminal portion to be decreased by this region.

The earth pad 70 is connected to the shielding ITO 210 of the counter substrate 200 with the conductive tape 170. Note that, the connection ITO (the connection conductive film) 80 of the earth pad 70 can be connected to a terminal provided on the end portion of the TFT substrate through a wire separately provided. In FIG. 3, the organic passivation film 108 is formed continuously to the organic passivation film 108 of the display region 400. However, a configuration may be possible, in which the organic passivation film 108 of the display region 400 is isolated from the organic passivation film 108 of the terminal portion 160 and the organic passivation film 108 of the terminal portion 160 is formed in an island shape. With this configuration, moisture can be prevented from being entered to the organic passivation film 108 of the display region 400 through the organic passivation film 108 of the terminal portion 160.

Figure 4:
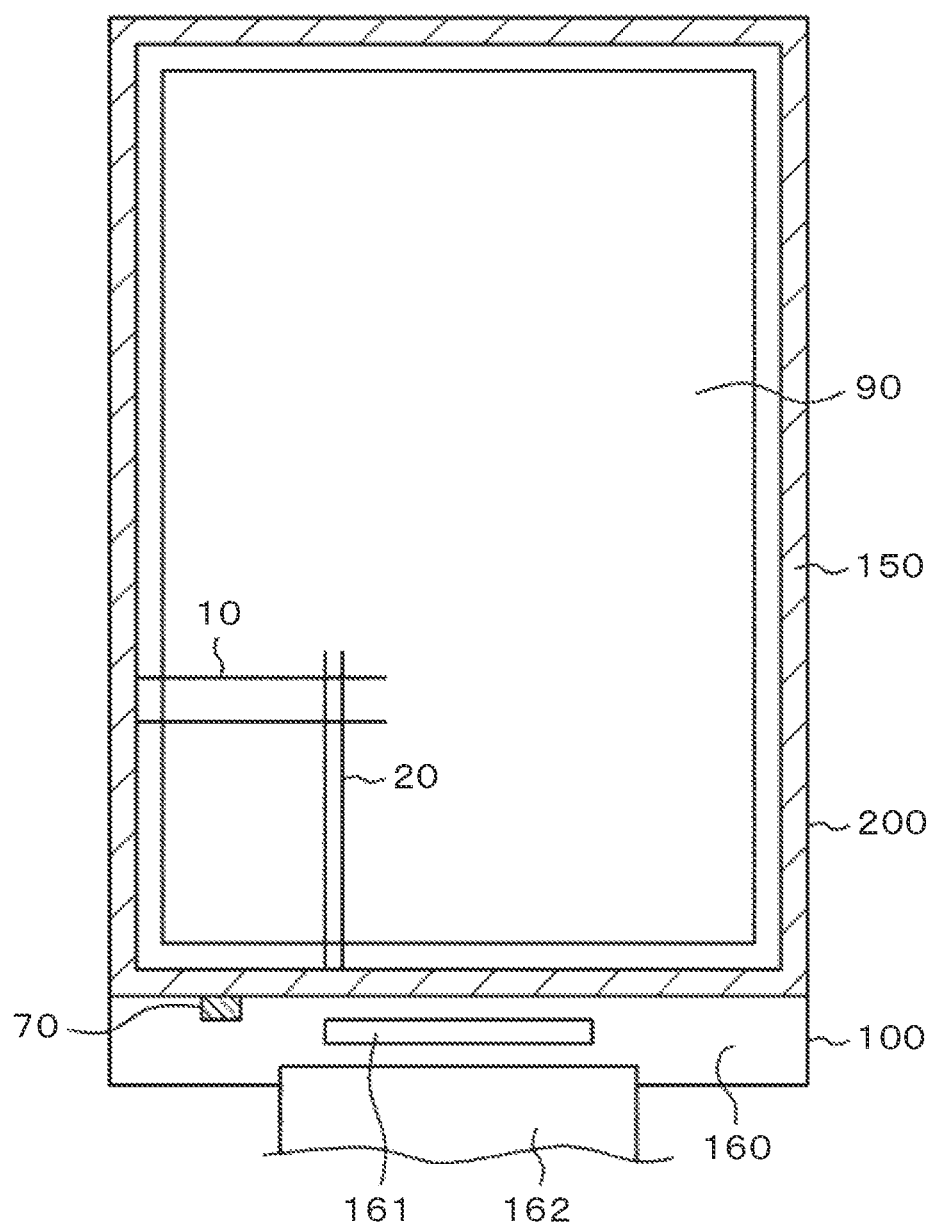
FIG. 4 is a plan view of a liquid crystal display device with no conductive tape.

FIG. 4 is a plan view of the liquid crystal display panel before the shielding ITO 210 is connected to the earth pad 70 with the conductive tape 170. In the terminal portion 160 in FIG. 4, the earth pad 70 is formed on the portion adjacent to the counter substrate 200. The earth pad 70 is configured of the organic passivation film 108 and the connection ITO 80 formed on the organic passivation film 108. The other configurations are similar to ones described in FIG. 1.

Figure 5:
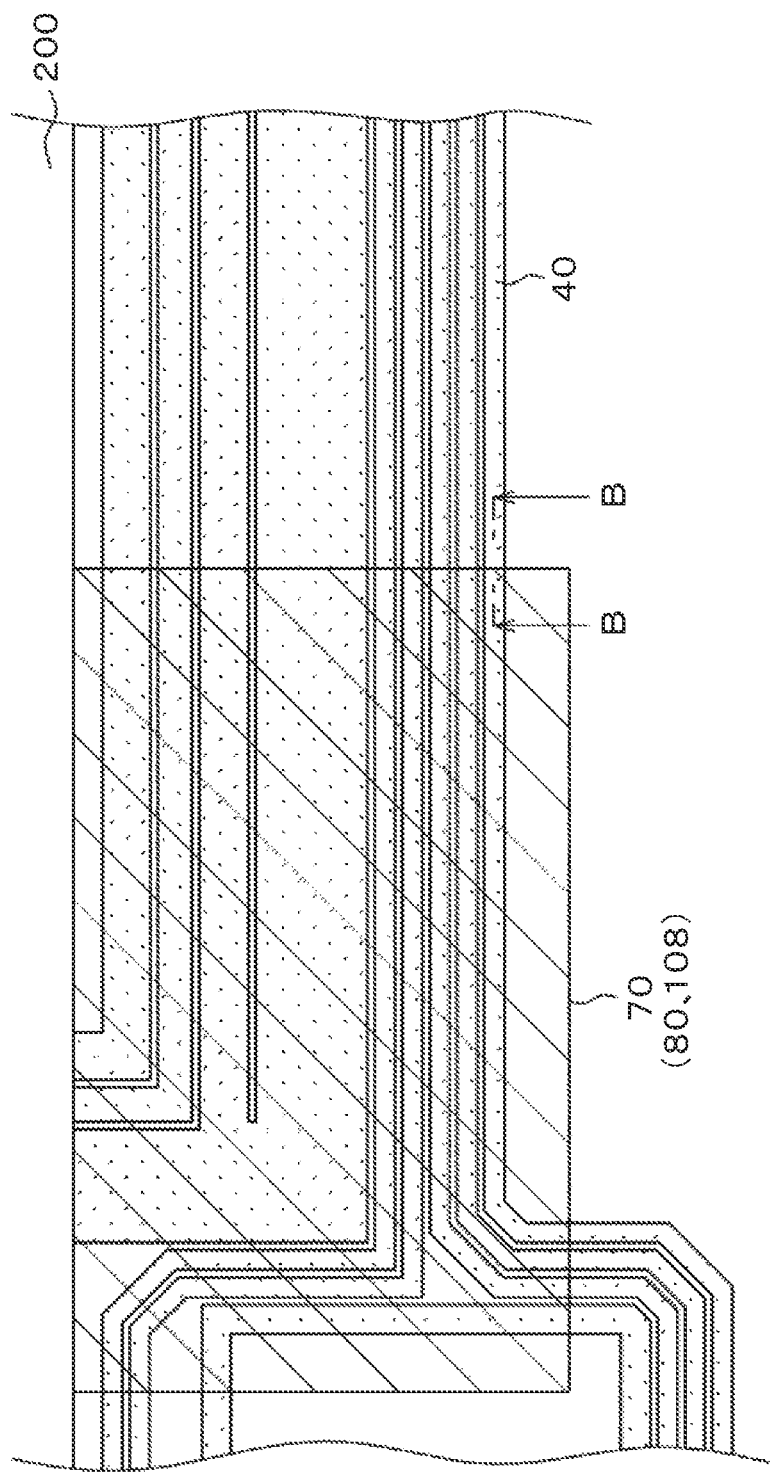
FIG. 5 is a plan view of a portion near an earth pad.

FIG. 5 is a plan view of the portion near the earth pad 70 in FIG. 4. In FIG. 5, the earth pad 70 is formed adjacent to the counter substrate 200. The earth pad 70 is a component having the connection ITO 80 formed on the organic passivation film 108. Below the organic passivation film 108, various wires are formed. Wires in wide width in FIG. 5 are wire regions. In these regions, a large number of narrow lead wires of the picture signal lines 20 may be formed.

Figure 6:
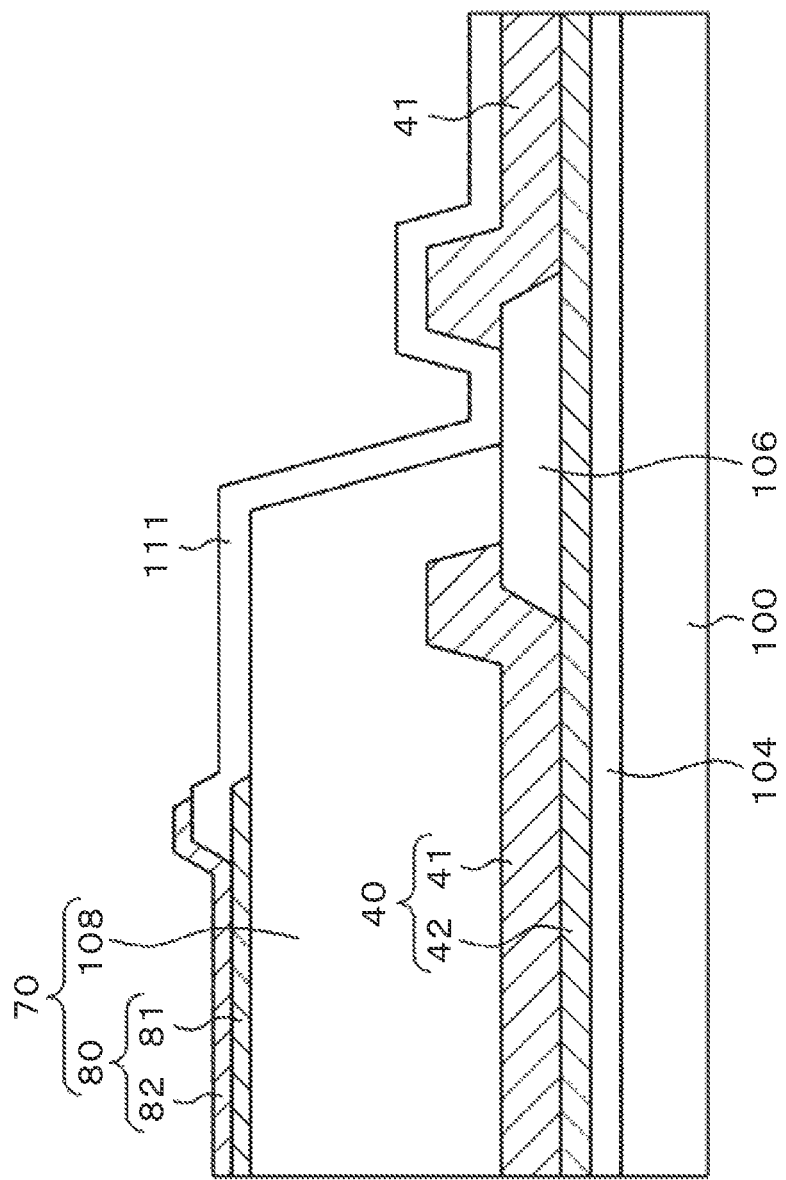
FIG. 6 is a cross sectional view taken along line B-B in FIG. 5.

FIG. 6 is a cross sectional view taken along line B-B in FIG. 5. In FIG. 6, a lead wire 40 is formed of a stack of a lead wire made of an Mo alloy 42 formed on the same layer as the scanning line 10 and a lead wire made of an Al alloy 41 formed on the same layer as the picture signal line 20. The lead wire 41 is formed of an Al alloy, for example. The lead wire 42 is formed of an Mo alloy, for example. In FIG. 6, the organic passivation film 108 is formed covering the lead wire 40, and the connection ITO 80 is formed on the organic passivation film 108. The earth pad 70 is formed of the connection ITO 80 and the organic passivation film 108.

The connection ITO 80 is formed of a first connection ITO 81 simultaneously formed with the common electrode 109 and a second connection ITO 82 simultaneously formed with the pixel electrode 112. The connection ITO 80 may be formed of only any one of the first connection ITO 81 and the second connection ITO 82. However, both of the common electrode 109 and the pixel electrode 112 are as thin as a thickness of 100 nm or less, and thus a two-layer structure is provided to improve reliability.

In FIG. 6, the terminal end portion of the organic passivation film 108 is covered with the capacitive insulating film 11 formed of SiN. This is because moisture is prevented from being entered to the organic passivation film 108. The lead wire 41 formed of Al is absent at the terminal end portion of the organic passivation film 108. This is because in patterning the first connection ITO 81, a risk of a short circuit between the lead wires 40 is eliminated, which is caused by the residue of the first connection ITO 81.

In other words, at the terminal end portion of the organic passivation film 108 in FIG. 6, the interlayer insulating film 106 is formed. At the terminal end portion of the organic passivation film 108, the lead wire 40 is connected only with the Mo alloy 42 formed on the same layer as the scanning line 10. However, at the portion beyond the terminal end portion of the organic passivation film 108, the lead wire 40 is again in the two-layer configuration of the Al alloy 41 and the Mo alloy 42. Therefore, there is almost no increase in the resistance of the lead wire 40.

In FIG. 6, the lead wire made of the Mo alloy 42 is formed on the gate insulating film 104. In FIG. 6, the first base film 101 and the second base film 102 are omitted. Finally, the conductive tape 170 is connected to the connection ITO 80, and the earth pad 70 is connected to the shielding ITO 210.

As described above, the wires, such as the lead wire 400, can also be formed below the earth pad 70. Thus, the area of the terminal portion can be decreased. The organic passivation film 108 of the terminal portion 160 can be simultaneously formed with the organic passivation film 108 on the display region 400. Consequently, processing loads are not increased.

Second Embodiment

Figure 7:
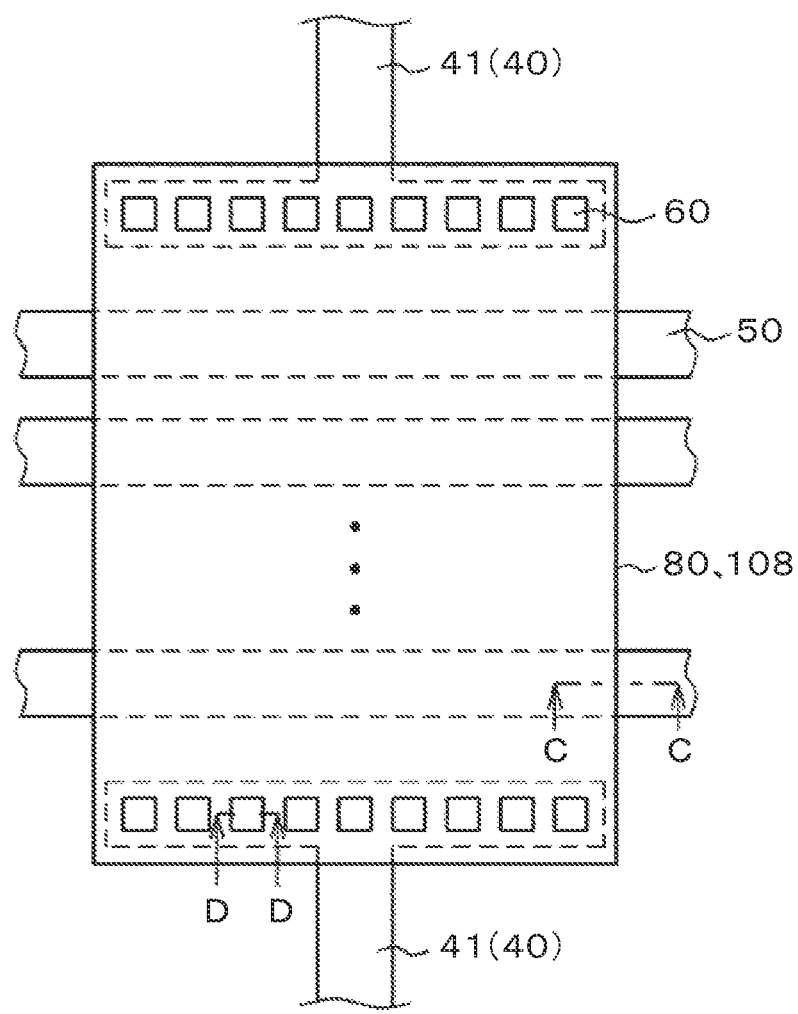
FIG. 7 is a plan view of a first form of a second embodiment.

The configuration in which the area of the terminal portion is decreased using the organic passivation film and the connection ITO described in the first embodiment is also applicable to the portions other than the terminal portion. FIG. 7 is a diagram of an example of decreasing the area of the terminal portion in which a lead wire made of an Al alloy 41 is three dimensionally crossed with an inspection wire 50, which are formed on a terminal portion 160, using an organic passivation film 108.

In FIG. 7, on the inspection wire 50 extending in the lateral direction, the organic passivation film 108 is formed in an island shape, and a connection ITO 80 is formed on the organic passivation film 108. A signal line 40 extends in the vertical direction. The signal line 40 can be three dimensionally crossed with the inspection wire 50 using the organic passivation film 108. The inspection wire 50 and the signal line 40 in FIG. 7 are both formed of the Al alloy 41 formed on the same layer as the picture signal line. The connection ITO 80 in FIG. 7 functions as a bridge between the signal lines 40 formed above and below the organic passivation film 108.

Figure 8:
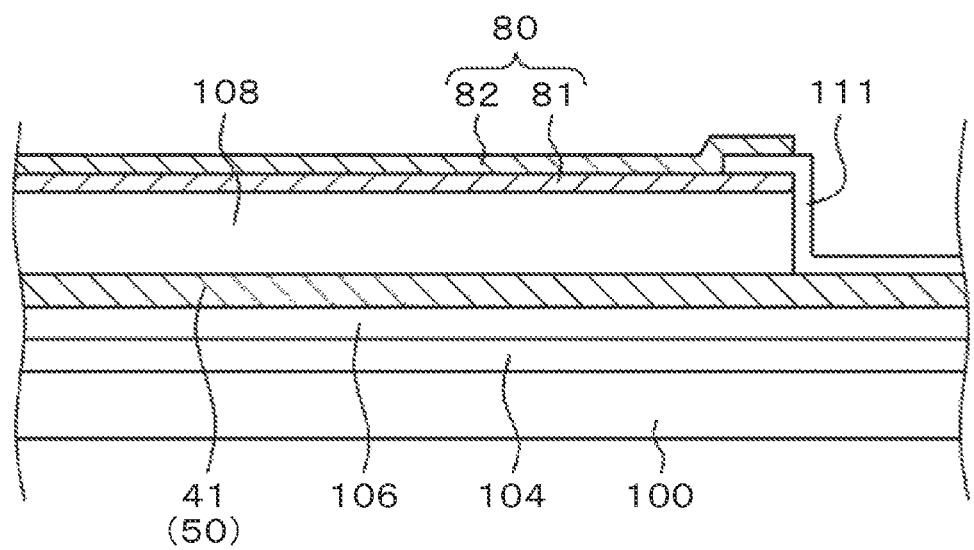
FIG. 8 is a cross sectional view taken along line C-C in FIG. 7.

FIG. 8 is a cross sectional view taken along line C-C in FIG. 7. In FIG. 8, the inspection wire 50 formed of the Al alloy 41 extends on a gate insulating film 104 and an interlayer insulating film 106 in the lateral direction. On the inspection wire 50, the organic passivation film 108 is formed. On the organic passivation film 108, the connection ITO 80 is formed. The connection ITO 80 has a two-layer structure of a first connection ITO 81 and a second connection ITO 82. The reason why this structure is provided is similar to the reason described in FIG. 6. On the end portion of the organic passivation film 108 and the Al alloy 41 uncovered with the organic passivation film 108, a capacitive insulating film 111 formed of SiN is formed. The capacitive insulating film 111 is formed for preventing the Al alloy 41 from corroding.

Figure 9:
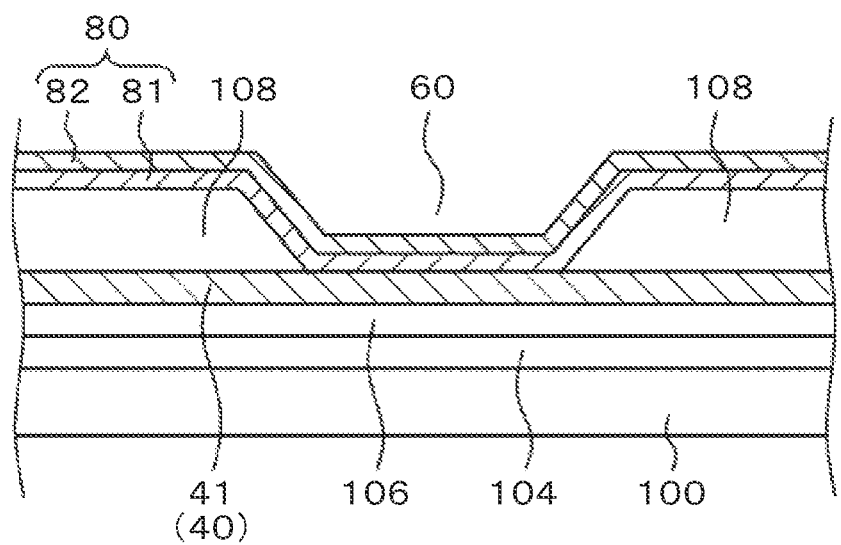
FIG. 9 is a cross sectional view take along line D-D in FIG. 7.

FIG. 9 is a cross sectional view taken along line D-D in FIG. 7D-D, illustrating a cross sectional view of a through hole 60 for connecting the signal line 40 to the connection ITO 80. In FIG. 9, on the gate insulating film 104 and the interlayer insulating film 106, the lead wire 40, such as a common wire formed of the Al alloy 41, is formed. The lead wire 40 is covered with the organic passivation film 108, and connected to the connection ITO through the through hole 60 formed on the organic passivation film 108. The connection ITO 80 has a configuration of a stack of the first connection ITO 81 and the second connection ITO 82.

As described in FIGS. 7 to 9, the lead wire 40 and the inspection wire 50 can be formed being overlapped with each other by forming the organic passivation film 108. Thus, the wiring area of the terminal portion can be made smaller. This configuration specifically exerts effects on wires with wide width, such as a common wire, specifically.

Figure 10:
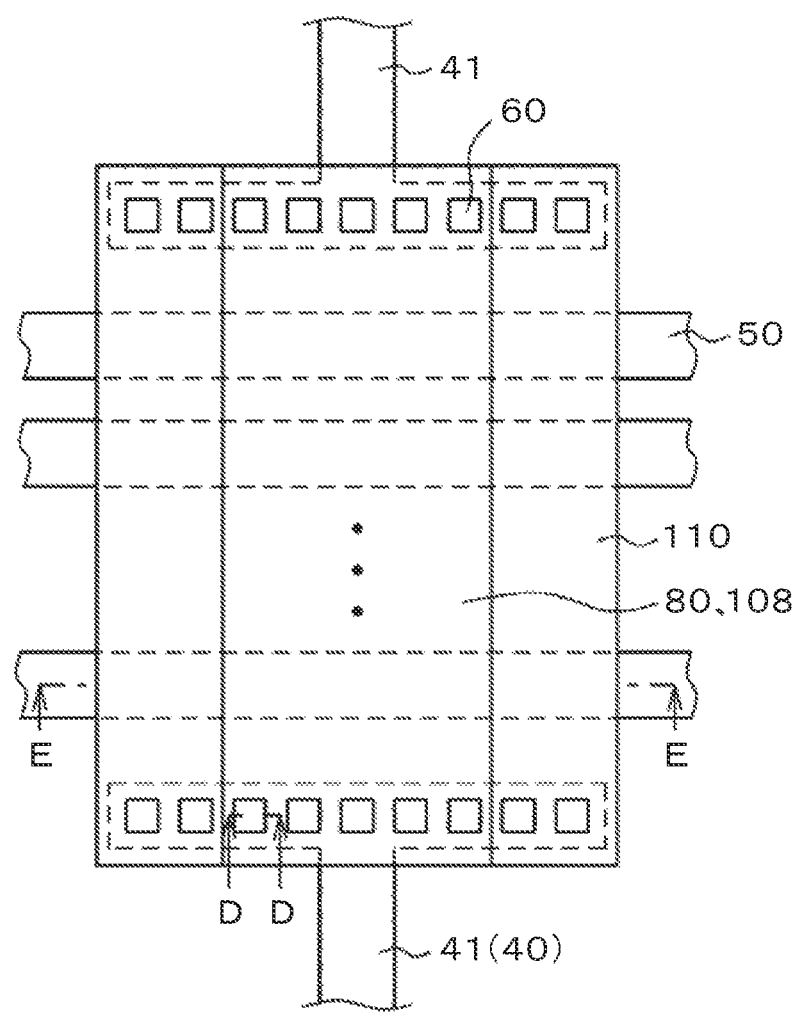
FIG. 10 is a plan view of a second form of the second embodiment.
Figure 11:
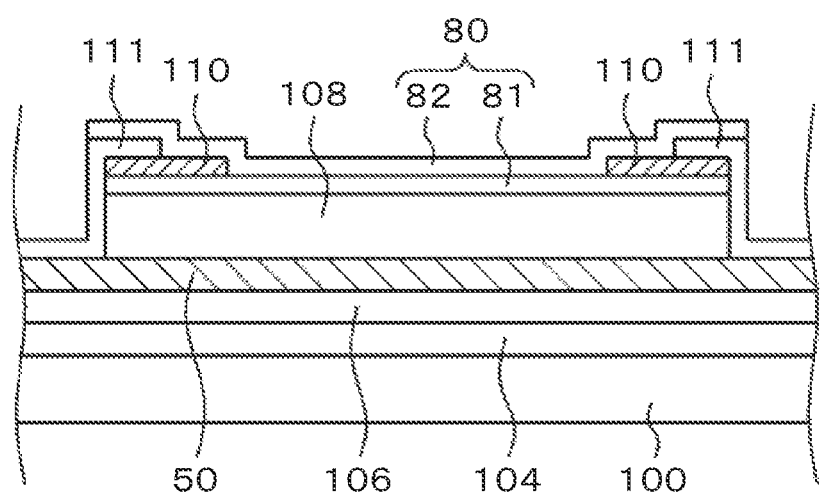
FIG. 11 is a cross sectional view taken along line E-E in FIG. 10.

The connection ITO 80 used for the bridge has a large resistivity, which sometimes causes a problem of wire resistance. FIGS. 10 and 11 are diagrams of a second form of the embodiment, illustrating a configuration for decreasing the wire resistance of the bridge by a stack of the common metal wire 110 and the connection ITO 80.

In FIG. 10, the inspection wire 50 formed of the Al alloy 41 extends in the lateral direction, and the organic passivation film 108 is formed covering the inspection wire 50. The signal lead wire 40 formed of the Al alloy 41 extends in the vertical direction, and bridged by the connection ITO 80 formed on the organic passivation film 108, which is similar to the configuration described in FIGS. 7 to 9.

In FIG. 10, the common metal wire 110 is formed being overlapped with the connection ITO 80 on both sides. The common metal wire 110 is formed of an Al alloy, for example, and thus the resistance of the bridge portion can be greatly decreased. A cross section taken along line D-D in FIG. 10, which is a cross section of the through hole 60, is similar to FIG. 9. Note that, the cross section of the through hole, on which the common metal wire 110 is formed, is in a configuration in which the common metal wire 110 is formed between the first connection ITO 81 and the second connection ITO 82 in FIG. 9.

FIG. 11 is a cross sectional view taken along line E-E in FIG. 10. In FIG. 11, on the gate insulating film 104 and the interlayer insulating film 106, the inspection wire 50 formed of the Al alloy 41 extends in the lateral direction. The organic passivation film 108 is formed in an island shape covering the inspection wire 50. On the organic passivation film 108, the first connection ITO 81 is formed, and the common metal wire 110 is stacked on both sides of the first connection ITO 81. The common metal wire 110 is also formed of the Al alloy 41. The second connection ITO 82 is formed covering the first connection ITO 81 and the common metal wire 110. The capacitive insulating film 111 formed of SiN is formed covering the side of the organic passivation film 108 and the inspection wire 50.

As illustrated in FIG. 11, the common metal wire 110 is stacked on the first connection ITO 81, and thus the resistance of the bridge wire can be greatly decreased. Note that, in FIG. 11, the common metal wire 110 is formed on the first connection ITO 81. However, the common metal wire 110 is sometimes formed below the first connection ITO 81. The effect is the same. In any cases, the order of processes for the display region has to be followed.

Figure 12:
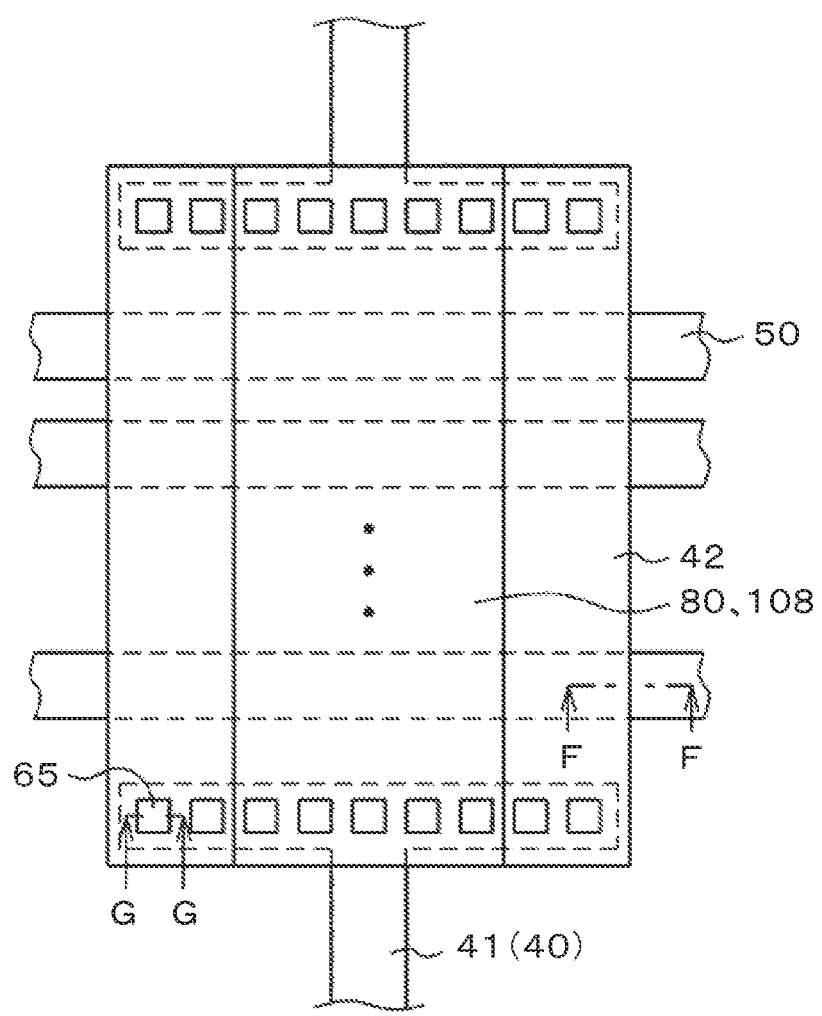
FIG. 12 is a plan view of a third form of the second embodiment.
Figure 13:
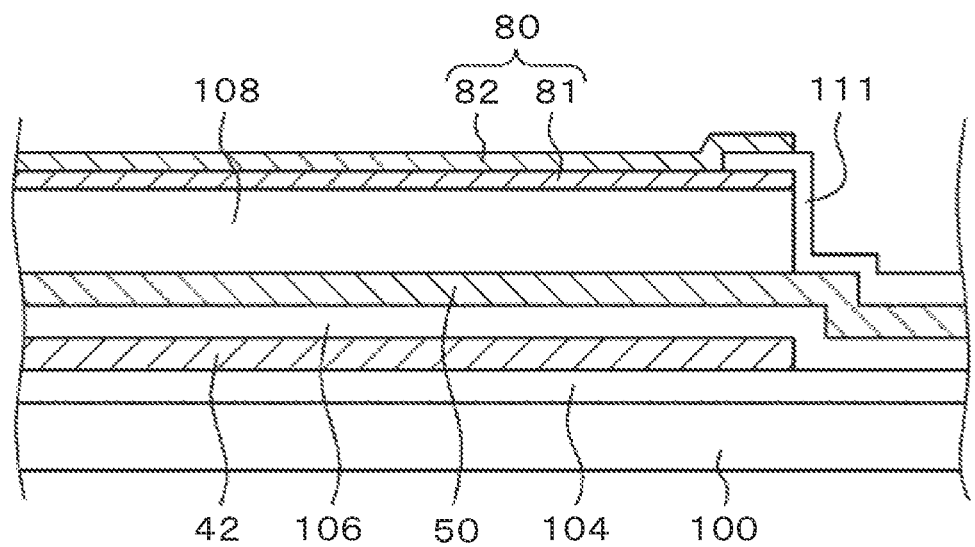
FIG. 13 is a cross sectional view taken along line F-F in FIG. 12.
Figure 14:
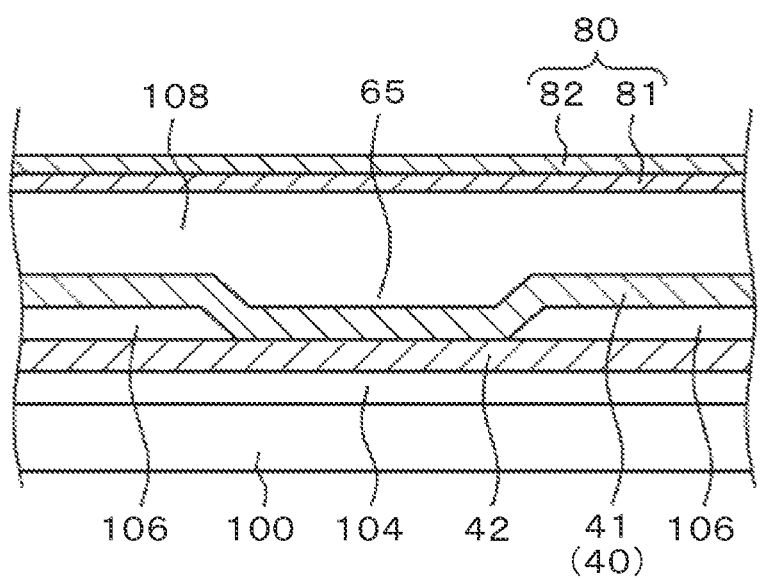
FIG. 14 is a cross sectional view taken along line G-G in FIG. 12.

FIGS. 12 to 14 are diagrams of a third form of the embodiment, illustrating another configuration for decreasing the resistance of the bridge connection formed on the island-shaped portion of the organic passivation film 108. The configuration of FIG. 12 is different from the configuration of FIG. 10 in that in order to decrease the resistance of the bridge connection, the Mo alloy 42 is used, which is formed on the lower side of the Al alloy 41 and formed on the same layer as the scanning line 10.

FIG. 13 is a cross sectional view taken along line F-F in FIG. 12. In FIG. 13, the bridge wire formed of the Mo alloy 42 is formed on the gate insulating film 104. On the interlayer insulating film 106 formed on the Mo alloy 42, the inspection wire 50 formed of the Al alloy 41 extends in the lateral direction. The organic passivation film 108 is formed in an island shape on the inspection wire 50. The first connection ITO 81 and the second connection ITO 82 are formed on the organic passivation film 108.

FIG. 14 is a cross sectional view taken along line G-G in FIG. 12, illustrating the cross section of a through hole 65 in the third form. In FIG. 14, the Mo alloy 42 used as a bridge electrode is formed on the gate insulating film 104. On the Mo alloy 42, the interlayer insulating film 106 is formed. On the interlayer insulating film 106, the Al alloy 41 for the wire 40 is formed. The Mo alloy 42 is connected to the Al alloy 41 through the through hole 65. The organic passivation film 108 is formed covering the lead wire 40 formed of the Al alloy 41. On the organic passivation film 108, a stack of the first connection ITO 81 and the second connection ITO 82, which is the bridge wire, is formed.

As described above, in the third form, the connection ITO 80 is formed on the upper side of the inspection wire with the organic passivation film 108 being sandwiched, and the electrode formed of the Mo alloy 42 is formed on the lower side of the inspection wire 50 with the interlayer insulating film 106 being sandwiched. Thus, the resistance of the bridge portion is decreased.

In the description above, the description is made in which the wire of the lower layer configuring the scanning line is formed of the Mo alloy, for example, and the wire of the upper layer configuring the picture signal line is formed of the Al alloy. However, the embodiment of the present invention is not limited to this configuration. The embodiment of the present invention is also applicable to the case in which the lower layer is formed of an Al alloy and the upper layer is formed of an Mo alloy. Moreover, the embodiment of the present invention is also applicable to the case in which both of the upper layer and the lower layer are formed of an Al alloy and to the case in which both of the upper layer and the lower layer are formed of an Mo alloy.

One of problems in the case in which wires are three dimensionally crossed with each other is a stray capacitance formed between the lower layer wire and the upper layer wire. In the embodiment of the present invention, the organic passivation film is used in the terminal portion. Thus, this allows a large gap to be provided between the lower layer wire and the upper layer wire, allowing a stray capacitance to be decreased. In the embodiment of the present invention, the thickness of the organic passivation film is in a range of 2 to 4 µm, and more preferably in a range of 3 to 4 µm.

In the description above, the description is made using an example in which the pad electrode or the bridge electrode formed on the organic passivation film is made of ITO. This is an example in the case in which the transparent conductive film to be used as the pixel electrode or the common electrode is formed of ITO. In the case in which the pixel electrode or the common electrode is formed of another transparent conductive film, which is formed of AZO and IZO, for example, the pad electrode or the bridge electrode can be formed of a material the same as these materials.

Figure 15:
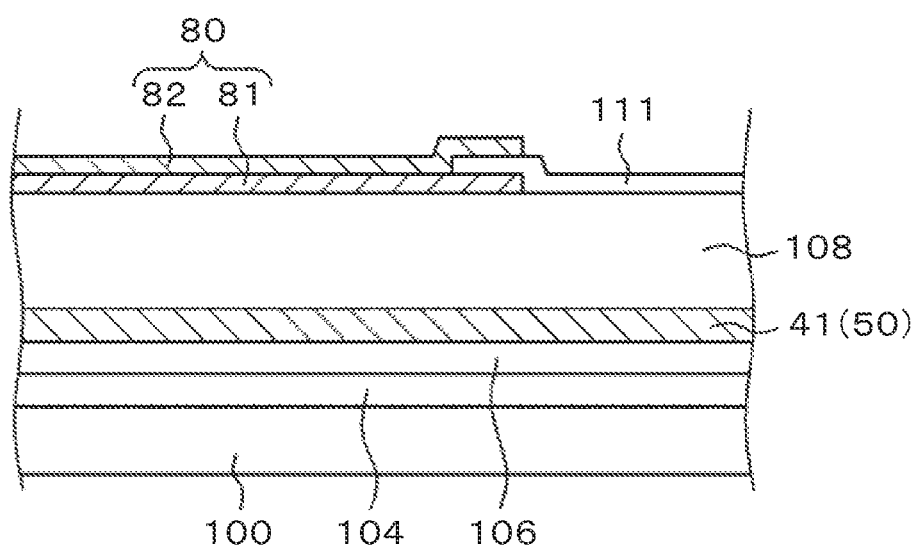
FIG. 15 is a cross sectional view of a fourth form of the second embodiment.

In the second embodiment, the description is made using an example of the configuration in which the signal wire in the terminal portion is three dimensionally crossed with the inspection wire through the organic passivation film. However, the wire of the lower layer is not limited to the inspection wire, which may be any wires. A configuration may be possible in which the lower layer is provided for a certain signal wire and the inspection wire is three dimensionally crossed with this signal wire through the organic passivation film. In any cases, a configuration may be possible in which the bridge electrode is used as a terminal, such as a bridge electrode to be contacted with an inspection probe. In the embodiments above, the organic passivation film is formed in an island shape, which is matched with the shape of the connection ITO 80. A configuration may be possible as in FIG. 15 in which the organic passivation film is formed in a wide, flat shape, not formed in an island shape. Similarly, also in FIGS. 11 and 13, a configuration may be possible in which the organic passivation film is formed in a flat shape, not formed in an island shape. The same thing is applied to the embodiment in FIG. 6. In this case, the Al alloy 41 of the lead wire 40 does not have to be separated at the end portion of the organic passivation film unlike the configuration in FIG. 6. Conversely, in the case in which the organic passivation film is provided in an island shape in any parts not limited to the pad portion and a wire is provided below the organic passivation film, in order to prevent a short circuit between wires caused by the transparent conductive film, the interlayer insulating film 106 is preferably provided between the organic passivation film and the wire below the organic passivation film at the end portion of the organic passivation film.

The embodiments of the present invention are suitable for the IPS-mode liquid crystal display device because the embodiments of the present invention can be implemented with no increase in processing loads. However, the embodiments of the present invention are also applicable to liquid crystal display devices in other modes, including twisted nematic (TN) and vertical alignment (VA) liquid crystal display devices, for example. The embodiments of the present invention are generally applicable to display devices, such as organic electroluminescent display devices, in addition to liquid crystal display devices.

What is claimed is:

1. A display device comprising:
a glass substrate;
an interlayer insulating film;
a capacitive insulating film;
an earth pad having an organic passivation film and a transparent conductive film; and
a first metal portion located directly under the organic passivation film of the earth pad,
wherein the first metal portion is not connected to the transparent conductive film of the earth pad,
the organic passivation film has a terminal end portion,
the interlayer insulating film is between the terminal end portion and the glass substrate, and is exposed from the organic passivation film outside of the terminal end portion,
the capacitive insulating film covers terminal end portion of the organic passivation film, and is in contact with the interlayer insulating film outside of the terminal end portion, and
the first metal portion extends across the terminal end portion.

2. The display device of claim 1, further comprising a second metal portion located directly under the organic passivation film of the earth pad,
wherein
each of the first metal portion and the second metal portion is a line,
the second metal portion extends in parallel to the first metal portion,
the second metal portion is not connected to the transparent conductive film, and
the second metal portion extends across the terminal end portion.

3. The display device of claim 2, further comprising a third metal portion located directly under the organic passivation film of the earth pad,
wherein
the third metal portion is a line,
the third metal portion extends in parallel to the second metal portion,
the third metal portion is not connected to the transparent conductive film, and
the third metal portion extends across the terminal end portion.

4. The display device of claim 1, further comprising a counter substrate,
wherein
the glass substrate has a first area and a second area,
the first area overlaps the counter substrate,
the second area is exposed from the counter substrate, and
the earth pad is located at the second area.

5. The display device of claim 4, further comprising a shielding transparent conductive film on the counter substrate, and a conductive material attached to the shielding transparent conductive film and the earth pad,
wherein
the first metal portion is not electrically connected to the shielding transparent conductive film.

6. The display device of claim 5, wherein
the first metal portion is sandwiched between the glass substrate and the organic passivation film of the earth pad, and
the first metal portion extends across the interlayer insulating film under the terminal end portion.

7. A display device comprising:
a thin film transistor substrate having a transparent conductive pad electrode, an organic passivation film, a first metal portion, a second metal portion, and a third metal portion; and
a counter substrate;
wherein
the thin film transistor substrate has a first area and a second area,
the first area overlaps the counter substrate,
the second area is exposed from the counter substrate,
the transparent conductive pad electrode is located at the second area,
each of the first metal portion, the second metal portion, and the third metal portion is not connected to the transparent conductive pad electrode,
each of the first metal portion, the second metal portion, and the third metal portion is located under the organic passivation film, and overlaps the transparent conductive pad electrode,
the transparent conductive pad electrode is located on the organic passivation film, and
each of the first metal portion, the second metal portion, and the third metal portion extends across the transparent conductive pad electrode.

8. The display device of claim 7,
wherein
each of the first metal portion and the second metal portion is a line,
the second metal portion extends in parallel to the first metal portion,
the second metal portion is not connected to the transparent conductive pad electrode.

9. The display device of claim 8,
wherein
the third metal portion is a line,
the third metal portion extends in parallel to the second metal portion,
the third metal portion is not connected to the transparent conductive pad electrode.

* * * * *